United States Patent [19]

Sono et al.

[11] Patent Number: 5,305,179
[45] Date of Patent: Apr. 19, 1994

[54] SURFACE-MOUNTING TYPE SEMICONDUCTOR PACKAGE HAVING AN IMPROVED EFFICIENCY FOR HEAT DISSIPATION

[75] Inventors: Michio Sono; Junichi Kasai; Kouji Saito; Kazuhiko Mitobe; Masanori Yoshimoto, all of Kawasaki, Japan

[73] Assignee: Fujitsu Limited, Kawasaki, Japan

[21] Appl. No.: 899,270

[22] Filed: Jun. 16, 1992

[30] Foreign Application Priority Data

Jun. 17, 1991 [JP] Japan .................. 3-144895
Jul. 17, 1991 [JP] Japan .................. 3-176821
Oct. 2, 1991 [JP] Japan .................. 3-255414

[51] Int. Cl.$^5$ ............................. H05K 7/20
[52] U.S. Cl. .................. 361/718; 174/16.3; 257/707; 257/796; 361/776
[58] Field of Search ............. 174/16.3, 52.4; 361/382, 386-389, 405; 357/81; 257/706, 707, 712, 713, 735, 783, 796; 165/80.3, 185

[56] References Cited

U.S. PATENT DOCUMENTS

| | | | |
|---|---|---|---|
| 3,899,719 | 8/1975 | Murphy | 361/405 |
| 4,012,769 | 3/1977 | Edwards | 174/76.3 |
| 4,387,413 | 6/1983 | Griffis | 361/405 |
| 4,546,406 | 10/1985 | Spinelli | 361/386 |
| 4,807,087 | 2/1989 | Sawaya | 361/405 |
| 4,811,166 | 3/1989 | Alvarez | 361/386 |
| 4,975,763 | 12/1990 | Baudouin | 357/74 |
| 5,049,973 | 9/1991 | Satriano | 357/70 |
| 5,126,820 | 6/1992 | Brown | 357/70 |

FOREIGN PATENT DOCUMENTS

| | | |
|---|---|---|
| 3305167 | 8/1984 | Fed. Rep. of Germany ...... 361/387 |
| 3421539 | 12/1985 | Fed. Rep. of Germany . |
| 63-181456 | 7/1988 | Japan .................. H01L 23/50 |

OTHER PUBLICATIONS

Patent Abstracts of Japan, vol. 12, No. 146 (E-605) (2993) 6 May 1988 & JP-A-62 263 667 (Hitachi Tobu Semiconductor) 16 Nov. 1987 * abstract *.
Research Disclosure, No. 316, Aug. 1990, Havant GB, pp. 628-631; 'Snap-On Heatsink Clamp' * paragraph 1-paragraph 3; FIG. 3 *.
Patent Abstracts of Japan, vol. 8, No. 264 (E-282) (1701) 4 Dec. 1984 & JP-A-59 136 956 (Roomu K. K.) 6 Aug. 1984 * abstract *.
Patent Abstracts of Japan, vol. 10, No. 259 (E-434) (2315) 4 Sep. 1986 & JP-A-61 084 841 (Toshiba Corp.) 30 Apr. 1986 * abstract *.
Patent Abstracts of Japan, vol. 9, No. 332 (E-370) 26 Dec. 1985 & JP-A-60 164 346 (Hitachi Densen) 27 Aug. 1985 *abstract *.

*Primary Examiner*—Gerald P. Tolin
*Attorney, Agent, or Firm*—Staas & Halsey

[57] ABSTRACT

A semiconductor device includes a semiconductor chip mounted in a resin package body. A plurality of interconnection leads are provided on the resin package body along a lower edge thereof and project outwardly from the lower edge. A heat dissipation lead is connected to the resin package body for dissipating heat generated by the semiconductor chip. The heat dissipation lead includes a plate of a heat conducting material having a stage part and a heat sink part, wherein the stage part is held inside the resin package body and supports the semiconductor chip thereon. The heat sink part projects outwardly from the resin package body and includes a part that extends in a downward direction. The heat sink part has a lower edge that is formed at a level substantially flush with the outer lead part of the interconnection leads such that the semiconductor device is held upright, when placed on a substrate, by the outer lead part of the interconnection leads and by the lower edge of the heat sink part of the heat dissipation lead.

16 Claims, 12 Drawing Sheets

| | THICKNESS (μm) | | |
|---|---|---|---|
| | Fe Alloy (t) | Cu Alloy (T) | Fe Alloy (t) |
| (1) | 20 | 110 | 20 |
| (2) | 25 | 100 | 25 |
| (3) | 30 | 90 | 30 |
| (4) | 40 | 70 | 40 |
| (5) | 50 | 50 | 50 |

SURFACE-MOUNTING TYPE SEMICONDUCTOR PACKAGE HAVING AN IMPROVED EFFICIENCY FOR HEAT DISSIPATION

BACKGROUND OF THE INVENTION

The present invention generally relates to semiconductor devices and more particularly to a semiconductor package having a single in-line structure.

In order to improve the efficiency for mounting semiconductor devices on a support substrate such as a printed circuit board, a package structure designed for surface mounting technology (SMT) is used extensively. By using surface mounting technology, a semiconductor device can be mounted on the circuit board without providing holes for inserting leads of the device. The soldering of the leads is achieved by merely placing the device on the circuit board and passing the device through a heating furnace for causing a reflowing of the solder alloy. Thereby, the efficiency of the mounting process is improved significantly and the fabrication cost of electronic apparatuses that use the semiconductor devices is significantly reduced.

In order to mount as many as possible of the semiconductor devices on a single support substrate, a single in-line package (SIP) is proposed. In a single in-line package, the leads are provided along a single edge of a flat package body to extend perpendicularly with respect to the edge, and the package body is held upright on the substrate by inserting the leads into corresponding holes in the substrate. As the package body is held vertically on the substrate, the number of packages that may be mounted on the substrate is increased. Further, such a structure is advantageous for cooling the device.

Figure 1:
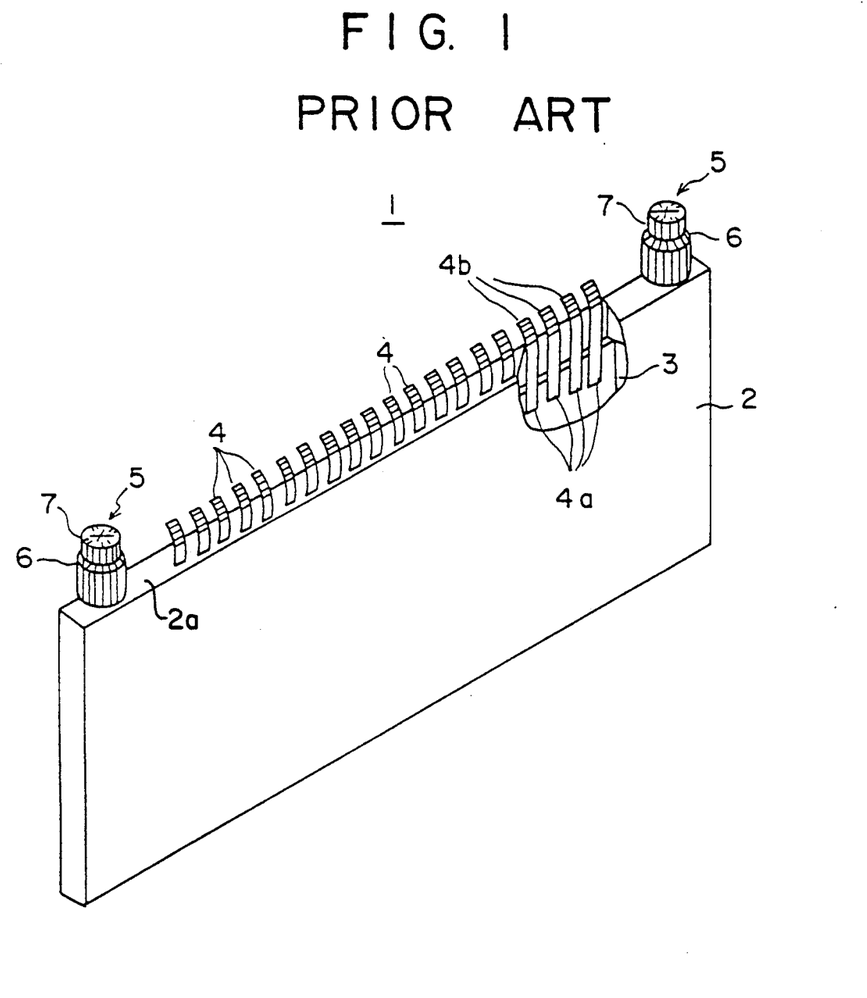
FIG. 1 is a diagram showing a conventional semiconductor package for surface mounting.

In order to combine the advantageous feature of the single in-line package with the advantageous feature of surface mounting technology, a package structure shown in FIG. 1 is proposed in the U.S. Pat. No. 4,975,763.

Referring to FIG. 1, the package designated by a numeral 1 includes a flat resin package body 2 that accommodates therein a semiconductor chip 3. At an edge 2a of the flat package body 2, there are provided a number of leads 4 having an inner lead part 4a connected to a bonding pad of the chip 3 and an outer lead part 4b extending outward from the edge 2a. Further, the outer lead part 4b of the leads 4 is bent laterally with respect to the extending direction of the leads 4. In order to support the package body 2 on a substrate at the time of mounting, there is provided a pair of studs 5 each including a stop portion 6 and a cylindrical clip portion 7 of a reduced diameter for insertion into a corresponding hole provided on the substrate.

Figure 2:
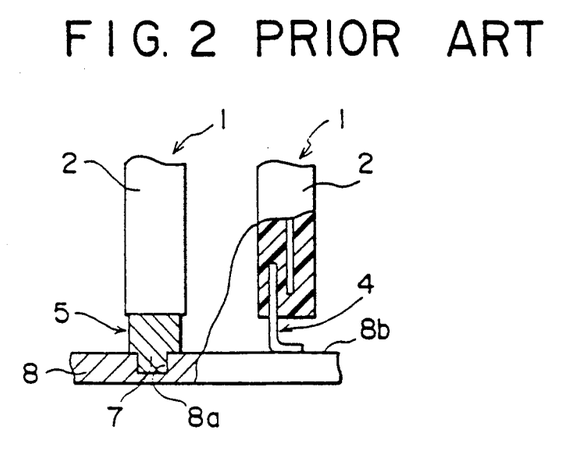
FIG. 2 is a diagram showing the mounting of the semiconductor device on a substrate.

FIG. 2 shows the mounting of the package 1 on a substrate 8, wherein the substrate 8 is formed with a hole 8a for holding the clip portion 7 of the stud 5. The portion 7 is inserted into the hole 8a as shown in FIG. 2 and the package body 2 is held upright on the substrate 8. The substrate 8 carries thereon a conductor pattern 8b for wiring, and the lead 4 is contacted with the conductor pattern 8b when the package 1 is held on the substrate 8. By passing the substrate 8 together with the package 1 in the state shown in FIG. 2 through a heating device, the soldering alloy provided on the conductor pattern 8b is caused to reflow and the lead 4 is soldered firmly upon the conductor pattern 8.

In this conventional package structure, there is a problem in that one has to provide the hole 8a on the substrate 8 in correspondence to the stud 5 for holding the package body 2 on the substrate 8. As each lead 4 has to engage with a corresponding pattern 8b when the package is mounted, it is necessary that the hole 8a be formed with high precision. This requirement is particularly acute in the recent semiconductor devices that have a large number of leads on the package body. Obviously, such a formation of the hole and the insertion of the stud into the hole undermine the advantageous feature of the surface mounting technology, and the efficiency of mounting is inevitably deteriorated.

Meanwhile, there are various semiconductor devices that generate heat upon operation. Thus, there is a need for a semiconductor package that facilitates efficient cooling of the device. The conventional package of FIG. 1 has a drawback with respect to this point in that the package lacks a cooling fin. Thus, the dissipation of the heat has to be achieved via the resin package body. As will be easily understood, such a process of heat dissipation is inefficient and the package structure of FIG. 1 can be used only for those devices that produce little heat. The process for mounting a cooling fin on the resin package body complicates the fabrication process of the device.

SUMMARY OF THE INVENTION

Accordingly, it is a general object of the present invention to provide a novel and useful semiconductor device wherein the foregoing problems are eliminated.

Another and more specific object of the present invention is to provide a semiconductor device that has a single in-line package of the surface mounting type wherein the efficiency for heat dissipation is improved.

Another object of the present invention is to provide a semiconductor device comprising a semiconductor chip; a resin package body that accommodates therein said semiconductor chip, said package body having a lower edge; a plurality of interconnection leads provided on said resin package body along said lower edge of the package body such that the interconnection leads project outwardly from said lower edge, each interconnection lead having an inner lead part held inside the package body and connected electrically to said semiconductor chip, and an outer lead part located outside said resin package body for engagement with a substrate that supports the semiconductor device thereon; and a heat dissipation lead held on said resin package body for dissipating heat generated by said semiconductor chip, said heat dissipation lead comprising a plate of a heat conducting material having a stage part and a heat sink part, said stage part being held inside said resin package body and supporting said semiconductor chip thereon, said heat sink part projecting outward from said resin package body and including a part that extends in a downward direction, said heat sink part having a lower edge that is formed at a level substantially flush with said outer lead part of said interconnection leads.

According to the present invention a semiconductor device is provided that can be held upright on a substrate such as a printed circuit board while maintaining an excellent efficiency of heat dissipation. It should be noted that the device is held upright on the substrate by the outer lead part of the interconnection leads and the heat dissipation lead. As the outer lead part of the interconnection leads is bent laterally for contacting with a conductor pattern on the substrate, such a semiconductor device is particularly suitable for mounting on the substrate by surface mounting technology. Thereby, the heat dissipation lead is used simultaneously as a heat sink and a mechanical support.

Another object of the present invention is to provide a semiconductor device comprising: first and second semiconductor chips that are separate from each other; a first resin package body for accommodating said first semiconductor chip, said first resin package body having a lower edge; a second resin package body for accommodating said second semiconductor chip, said second resin package body having a lower edge; first group interconnection leads provided on said first package body to project outwardly from said first package body at said lower edge thereof, said first group interconnection leads including a plurality of leads each having an inner lead part held inside the first package body and connected electrically to said first semiconductor chip, and an outer lead part located outside said first resin package body and bent laterally for engagement with a substrate; second group interconnection leads provided on said second package body to project outward from said second package body at said lower edge thereof, said second group interconnection leads including a plurality of leads each having an inner lead part held inside the second resin package body and connected electrically to said second semiconductor chip, and an outer lead part located outside the package body and bent laterally for engagement with said substrate; and a heat dissipation lead connecting said first resin package body and said second resin package body with each other, said heat dissipation lead comprising a first stage part embedded within said first resin package body for holding said first semiconductor chip thereon, a second stage part embedded within said second resin package body for holding said second semiconductor chip thereon, and a heat sink part located outside said first and second resin package bodies for bridging said first stage part and said second stage part.

According to the present invention, the semiconductor device is held upright on the substrate by the first group interconnection leads and the second group interconnection leads. Thus, device is suitable for the mounting on the substrate by surface mounting technology. Simultaneously, the device achieves an efficient cooling by the heat sink part that connects the first and second resin package bodies.

Other objects and further features of the present invention will become apparent from the following detailed description when read in conjunction with the attached drawings.

DETAILED DESCRIPTION OF THE PREFERRED EMBODIMENTS

Figure 3:
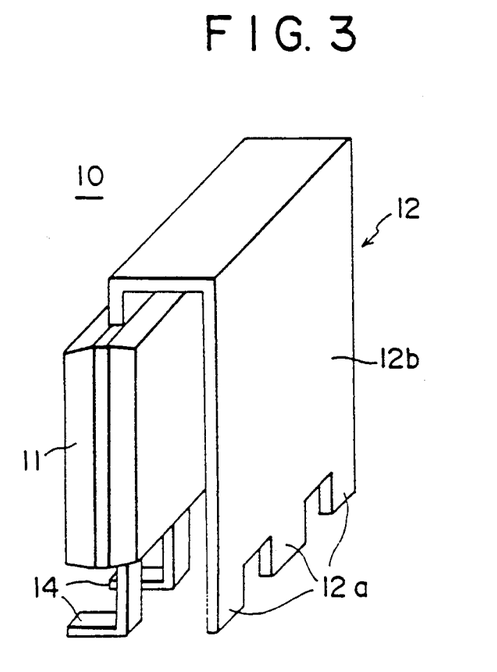
FIG. 3 is a diagram showing a semiconductor device having a package according to a first embodiment of the present invention in a plan view.
Figure 4:
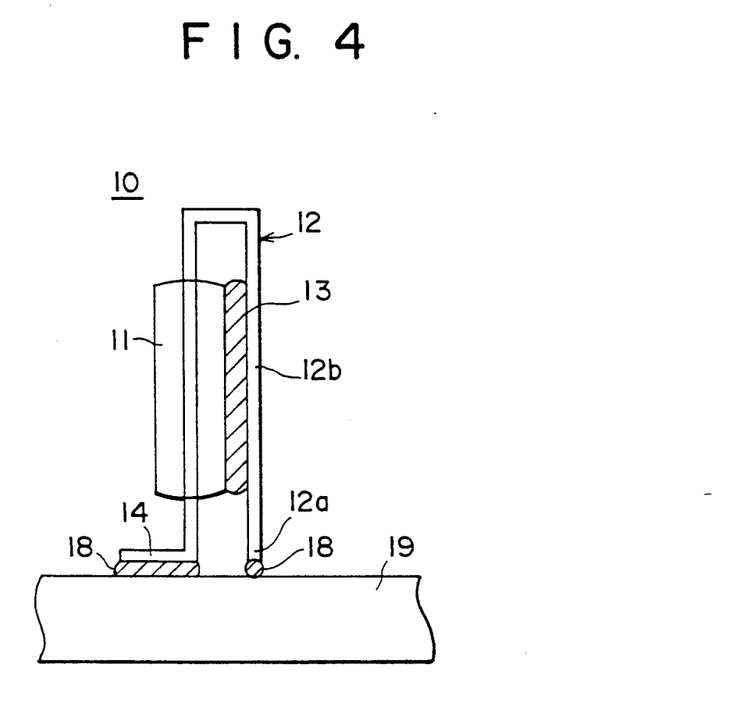
FIG. 4 is a diagram showing the semiconductor device of FIG. 3 in a side view mounted on a substrate.

Hereinafter, the description will be made on a semiconductor device 10 according to a first embodiment of the present invention with reference to FIGS. 3–5, wherein FIG. 3 shows the device 10 in a perspective view while FIG. 4 shows the device 10 in a side view. Further, FIG. 5 shows the device 10 in an elevational cross section.

Figure 5:
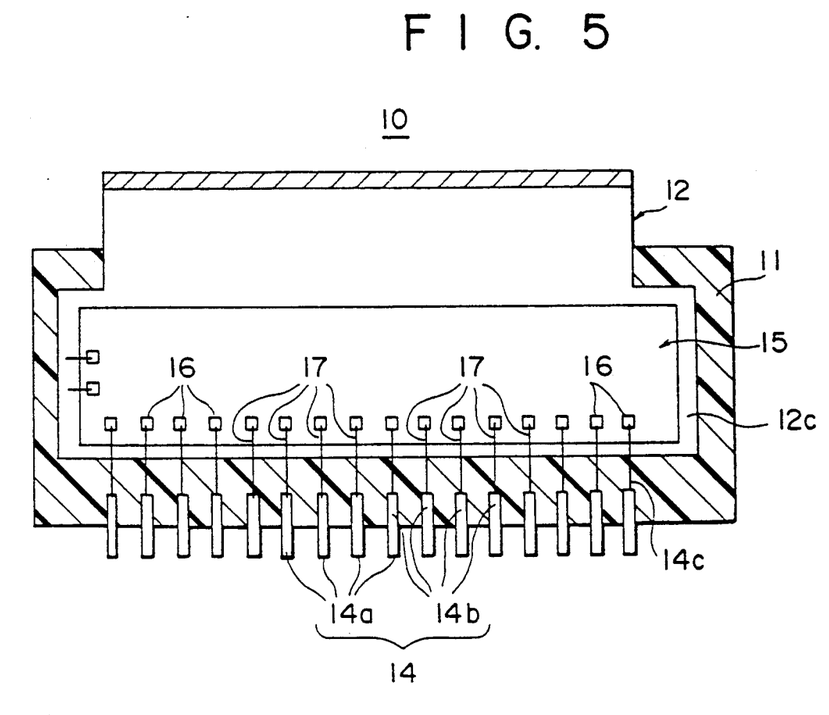
FIG. 5 is a diagram showing the semiconductor device of FIG. 3 in an elevational cross section.

Referring to the drawings, the semiconductor device 10 includes a package body 11 of an epoxy resin in which a semiconductor chip 15 is embedded as shown in FIG. 5 by a transfer molding process. The package body 11 has a flat shape defined by a pair of opposing flat major surfaces. At the bottom edge of the package 11, a plurality of interconnection leads 14 are provided to extend in a downward direction, while there is provided a heat dissipation lead 12 to extend in an upward direction from the top edge of the package body 11. The heat dissipation lead 12 thus extending in the upward direction is then bent twice successively, each time by an angle of about 90 degrees, and extends in the downward direction along the flat major surface of the package body 11. Thereby, the part of the heat dissipation lead 12 that is located outside the package body 11 forms a heat sink part 12b that is ended at a lower edge part 12a. On the other hand, the heat dissipation lead 12 has a stage or base part 12c that is embedded in the package body 11 such that the stage part 12c supports the semiconductor chip 15 thereon. See the cross sectional view of FIG. 5.

Referring to FIG. 5, it should be noted that each lead 14 is formed of an outer lead part 14a projecting outward from the package body 11 and an inner lead part 14b held inside the package body 11. The inner lead part 14b is connected to the semiconductor chip 15 by a bonding wire 14c. The outer lead part 14a is bent laterally at an angle of about 90 degrees as shown in FIG. 4 for engagement with a substrate 19 such as a printed circuit board. It should be noted that the substrate 19 carries thereon conductor patterns forming a circuit with solder 18 provided thereon. Further, the heat dissipation lead 12 is formed such that the lower edge part 12a is formed at a level substantially flush with the level of the laterally-bent outer lead part 14a of the interconnection leads 14.

By constructing the device as such, the device is held upright on the substrate 19 by the interconnection lead 14 and the heat dissipation lead 12. Thus, by passing the device together with the substrate 19 through a heating fixture, a reflowing of the solder 18 occurs and the device is mounted firmly upon the substrate 19 as indicated in FIG. 4. Thereby, the device of the present embodiment can be mounted on the substrate by surface mounting technology and the efficiency of production of the electronic apparatuses is improved significantly. Further, the package structure as disclosed in the present embodiment is applicable to devices wherein the semiconductor chip 15 generates substantial heat. The heat is transferred from the chip 15 to the heat sink part 12b along the heat dissipation lead 12 and radiated into the space. In the embodiment of FIG. 4, it can be seen that the heat sink part 12b of the heat dissipation lead 12 is fixed upon the inside flat major surface of the package body 11 by a heat-conductive adhesive 13. Thereby, the efficiency of heat dissipation from the semiconductor chip 15 to the heat sink part 12b and further to the space is even more improved.

Figure 6:
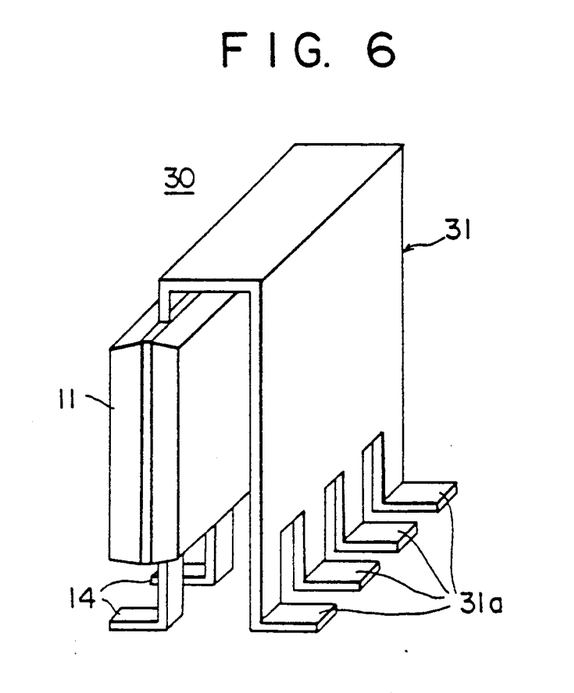
FIG. 6 is a diagram showing a modification of the device of FIG. 3.
Figure 7:
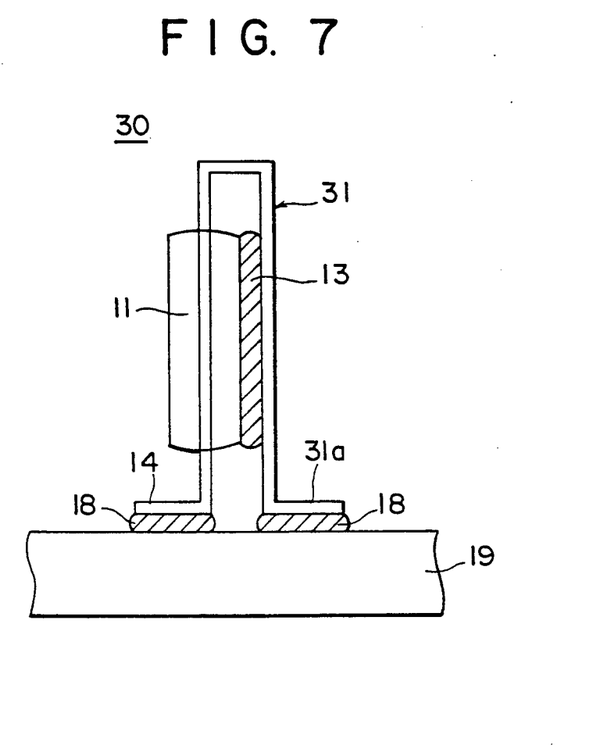
FIG. 7 is a diagram showing the mounting of the semiconductor device of FIG. 6 on a substrate.

FIG. 6 shows a semiconductor device 30 according to a modification of the semiconductor device 10 of FIG. 3. In the device of FIG. 6, a heat dissipation lead 31 substantially identical with the heat dissipation lead 12 is used, wherein the heat dissipation lead 31 is different from the heat dissipation lead 12 in that the heat dissipation lead 31 has a lower edge part 31a that is formed into a comb-shape and is bent laterally for bending the part 31a laterally, the area for soldering, the lead 31 on the substrate is increased as shown in FIG. 7. Preferably, the teeth of the lower edge part 31a are provided in correspondence to the gap formed between the adjacent interconnection leads 14 for avoiding possible short circuit connection. Further, the comb-shape construction of the lower edge part 31a facilitates the bending process.

Figure 8:
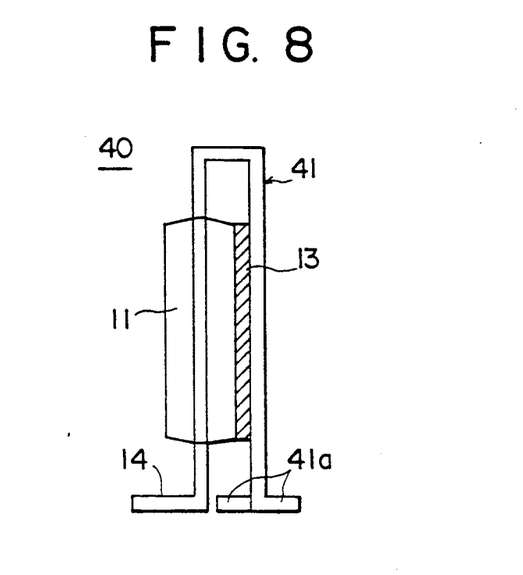
FIG. 8 is a diagram showing a modification of the device of FIG. 6.

FIG. 8 shows a semiconductor device 40 according to a modification of the device 30 of FIG. 6, wherein the device has a heat dissipation lead 41 similar to the heat dissipation lead 31 except that the heat dissipation lead 41 has a lower edge part 41a that is bent in two, opposite lateral directions. Each tooth of the comb-shaped part 41a is bent laterally and alternately in two opposing directions for improved mechanical stability on the substrate. Alternatively, the teeth of the comb-shaped part 41 may be bent in either of the two opposing directions to avoid any obstacles provided on the substrate.

Figure 9:
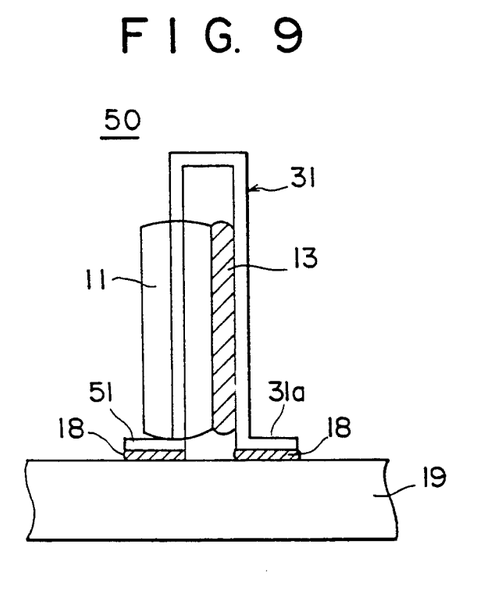
FIG. 9 is a diagram showing another modification of the device of FIG. 6.

FIG. 9 shows a semiconductor device 50 according to a modification of the device 30 of FIG. 7, wherein the device 50 has interconnection leads 51 corresponding to the interconnection leads 14 except that each lead has an outer lead part that is bent laterally at the lower edge of the package body 11 where the lead projects outwardly from the package body. Thereby, the length of the lead 51 is reduced and the delay in the signal transmission through the lead is minimized. Further, such a reduction in the length of the lead 51 minimizes the chance that external noises will penetrate into the circuit from the exposed part of the interconnection lead 51. In correspondence to the reduced length of the interconnection lead 51, the heat dissipation lead 31 is formed with a reduced length such that the lower edge 31a is formed with a flush relationship with the outer lead part of the interconnection lead 51.

Figure 10:
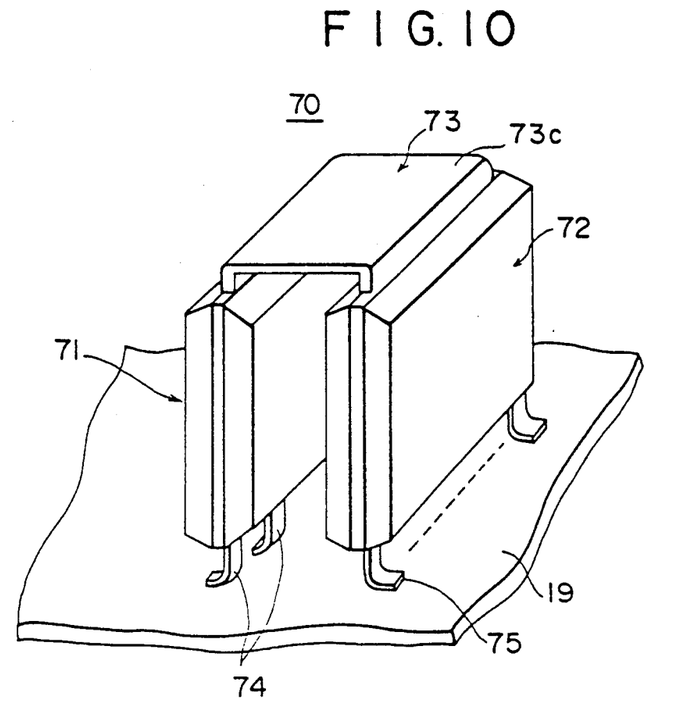
FIG. 10 is a diagram showing a semiconductor device having a package according to another embodiment of the present invention in a perspective view.

FIG. 10 shows a semiconductor device 70 according to another embodiment of the present invention.

Figure 11:
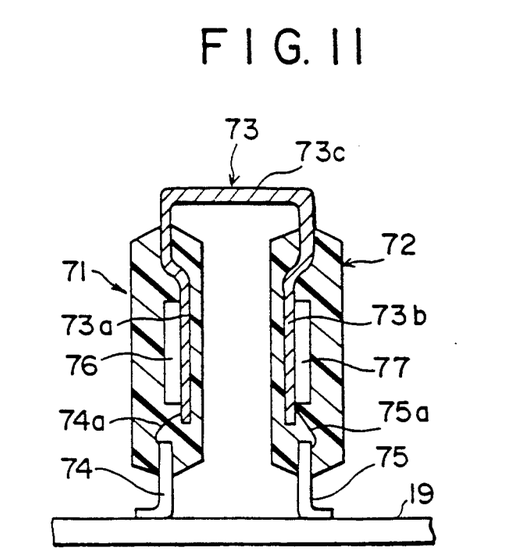
FIG. 11 is a diagram similar to FIG. 4 showing the semiconductor device of FIG. 10 in a side view mounted on a substrate.

Referring to FIG. 10, the semiconductor device 70 includes first and second resin package bodies 71 and 72 connected with each other by a heat dissipation lead 73. As shown in the cross sectional view of FIG. 11, the heat dissipation lead 73 includes a first stage part 73a supporting thereon a first semiconductor chip 76 and embedded in the first resin package body 71, and a second stage part 73b supporting thereon a second semiconductor chip 77 and embedded in the second resin package body 72. Further, the heat dissipation lead 73 includes a heat sink part 73c that is located outside the package bodies 71 and 72 and connecting the first and second stage parts 73a and 73b with each other. The heat sink part 73c extends upwardly from the upper edge of the package bodies 71 and 72. On the other hand, interconnection leads 74 are provided to extend in the downward direction at the lower edge of the package body 71, while interconnection leads 75 are provided to extend in the downward direction at the lower edge of the package body 72. It should be noted that each interconnection lead 74 is connected to the semiconductor chip 76 by a bonding wire 74a. Similarly, each interconnection lead 75 is connected to the semiconductor chip 77 by a bonding wire 75a. Further, the outer ends of the interconnection leads 74 and 75 are bent laterally at substantially an identical level as indicated in FIG. 11. Thereby, the semiconductor device 70 is held upright on the substrate 19 by the interconnection leads 74 and 75 as shown in FIGS. 10 and 11.

Figure 12:
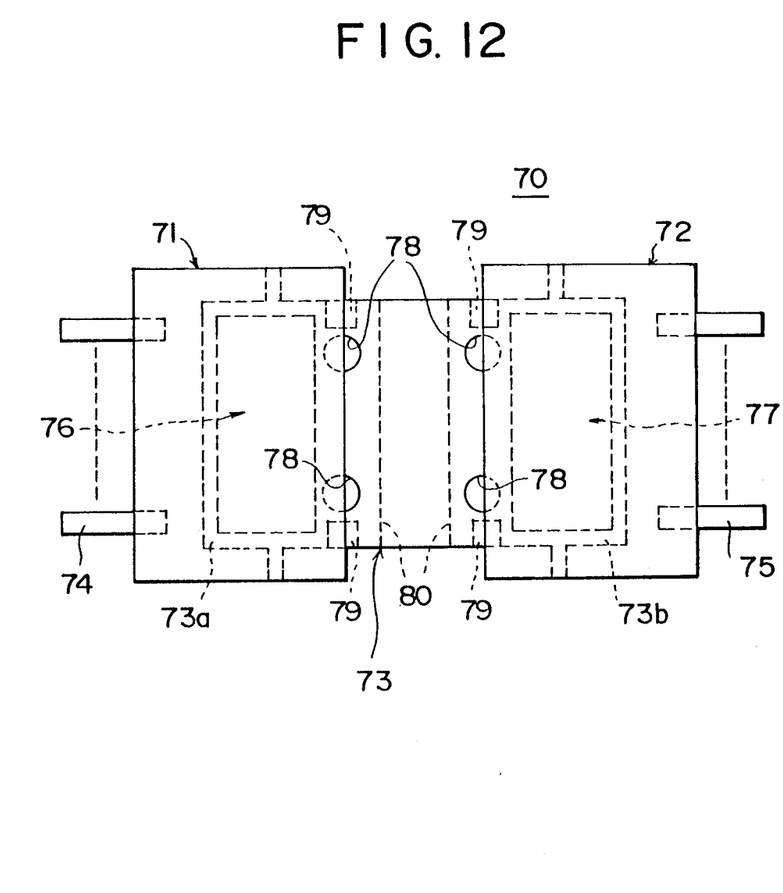
FIG. 12 is a diagram showing the internal structure of the device of FIG. 10 in the state that the device is unfolded in an extended position.

FIG. 12 shows the semiconductor device 70 in the state that the heat dissipation lead 73 is unfolded. In FIG. 12, it will be seen that there are provided anchor holes 78 and cutouts 79 for improving the intimate contact between the resin that forms the package body and the heat dissipation lead 73. Further, V-shaped grooves 80 are provided on the heat dissipation lead 73 for facilitating the bending thereof. The molding of the device is achieved in the state of FIG. 12, and the heat dissipation lead 73 is bent subsequently to form the device shown in FIG. 10.

Figure 13:
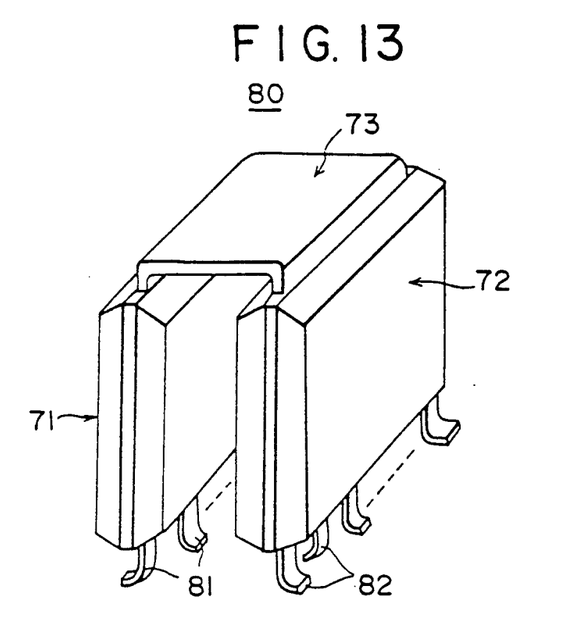
FIG. 13 is a diagram showing a modification of the device of FIG. 10.

FIG. 13 shows a semiconductor device 80 according to a modification of the device 70 wherein inter connection leads 81 and 82 are used in place of the interconnection leads 74 and 75. There, the leads forming the interconnection leads 81 are bent laterally in opposite directions to avoid any obstacles formed on the surface of the substrate 19, similarly to the embodiment of FIG. 8.

Figure 14:
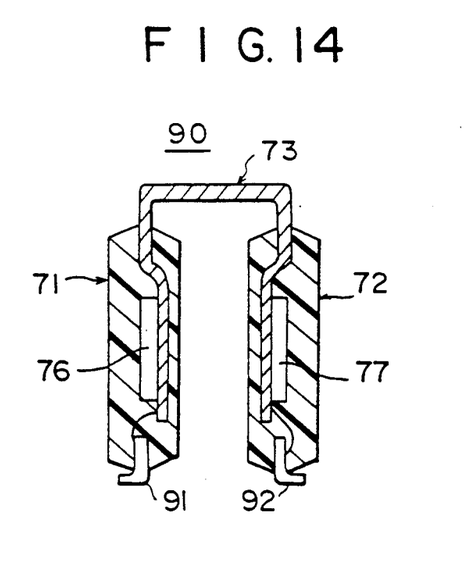
FIG. 14 is a diagram showing another modification of the device of FIG. 10 in a cross sectional view.

FIG. 14 shows a semiconductor device 90 according to another modification of the device 70 wherein interconnection leads 91 and 92 are bent at the lower edge of the package bodies 71 and 72. By constructing the device as such, the signal delay caused by the interconnection lead is minimized similarly to the embodiment of FIG. 9. Associated therewith, the penetration of noise into the semiconductor circuits in the chips 76 and 77 via the interconnection leads 91 and 92 is minimized.

Figure 15:
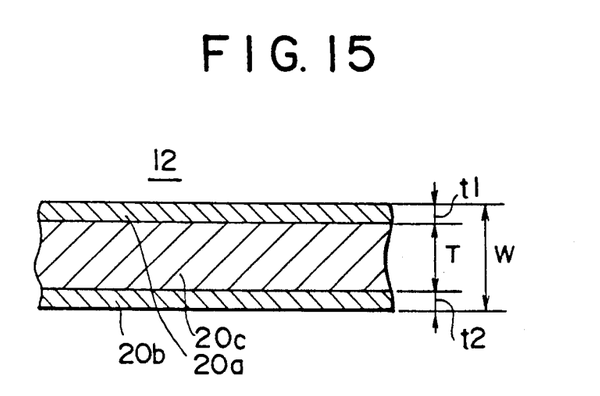
FIG. 15 is a diagram showing the construction of a composite heat dissipation lead used in the package of the present invention.

FIG. 15 is a diagram showing a cross section of a lead frame from which the heat dissipation lead 12 and the interconnection leads 14 of the semiconductor device of FIG. 3 are formed. It should be noted, however, that the description given hereinafter with respect to the structure of the lead frame is applicable also to the heat dissipation leads and the interconnection leads of other embodiments.

Referring to FIG. 15, it will be seen that the heat dissipation lead 12 includes a plate 20c of a copper alloy (MF202 - a trade name, an alloy of Cu-Sn-Zn), and clad layers 20a and 20b, both of a Fe-Ni alloy, cover the first and second, mutually opposing major surfaces of the plate 20c, respectively. The clad layers 20a and 20b may be provided, for example, by a thermal bonding process. By using such a composite structure for the heat dissipation leads 12 as well as for the interconnection leads 14, it is possible to impart various preferable features to these parts such as a high electrical conductivity, a high mechanical strength and a high thermal conductivity.

In order to obtain the desirable property as set forth above, it is preferable to set the thicknesses $t_1$ and $t_2$ of the clad layers 20a and 20b with respect to the thickness T of the copper alloy plate 20c to satisfy a relationship $$0.3 \leq (t/T) \leq 2, \tag{1}$$

where t represents the total thickness of the clad layers 20a and 20b ($t = t_1 + t_2$). Designating the total thickness of the heat dissipation lead 12 by a parameter W as indicated in FIG. 15, it is also preferable to set the ratio t/W to fall in the range $$0.4 \leq (t/W) \leq 0.7. \tag{2}$$

Figure 16:
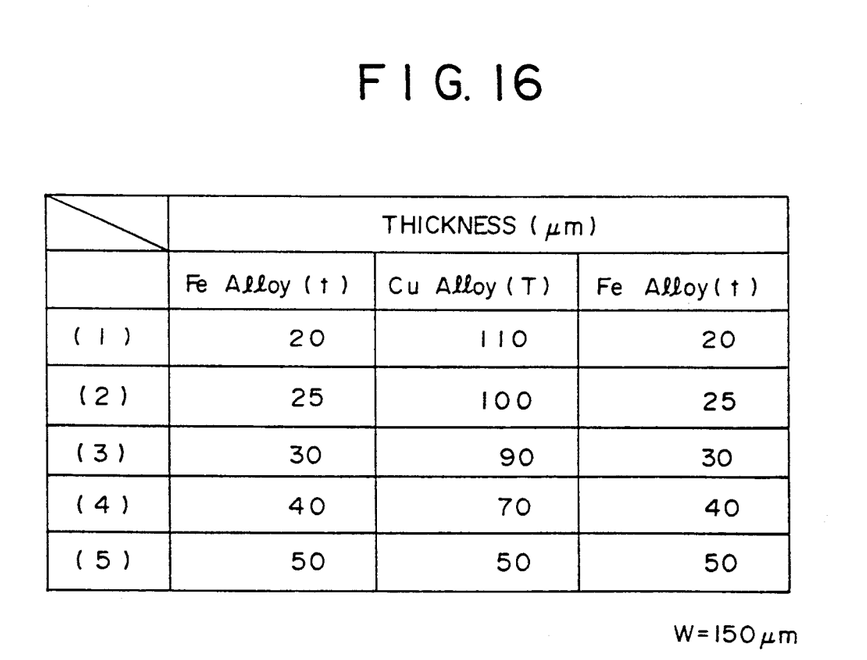
FIG. 16 is a diagram showing various combinations of materials used for the heat dissipation lead of FIG. 15.

Within the range where the foregoing two conditions (1) and (2) are met, one can set the thickness of the layers 20a, 20b and 20c as desired. FIG. 16 shows a few examples of combinations that satisfy the foregoing requirements, under a constraint that the thickness $t_1$ is set equal to the thickness $t_2$ and that the total thickness W is set to about 150 μm.

Figure 17A:
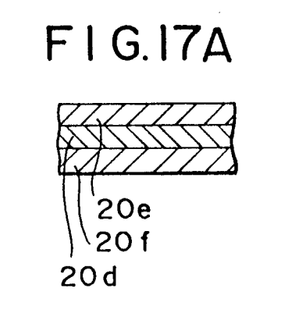
FIGS. 17(A)–17(C) are diagrams showing the structure of other composite heat dissipation leads.
Figure 17B:
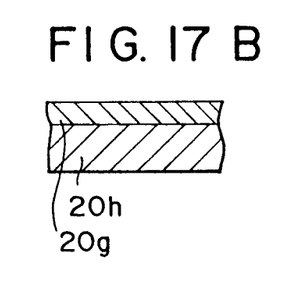
Figure 17C:
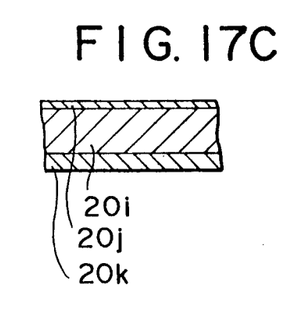

Further, it should be noted that, as long as the foregoing conditions (1) and (2) are met, one may modify the construction of the lead frame as shown in FIGS. 17(A)-17(C), where FIG. 17(A) shows a case that clad layers 20e and 20f of the copper alloy are used to cover a core layer 20d of the Fe-Ni alloy, whereas FIG. 17(B) shows a structure wherein a single clad layer 20g of the Fe-Ni alloy covers a core layer 20h of the copper alloy. Further, FIG. 17(C) shows a structure similar to the structure of FIG. 15 except that the thickness of both clad layers 20j and 20k, provided at both sides of a core layer 20i of the copper alloy in correspondence to the clad layers 20a and 20b, is made non-uniform. Even in the case of FIGS. 17(A)-17(C), one can obtain a lead frame member that has a sufficient electric and thermal conductivity as well as a sufficient mechanical rigidity, as long as the foregoing conditions (1) and (2) are met.

FIGS. 18(A)-18(F) are diagrams showing the construction of the stage part 12c of the device shown in FIG. 5.

Figure 18A:
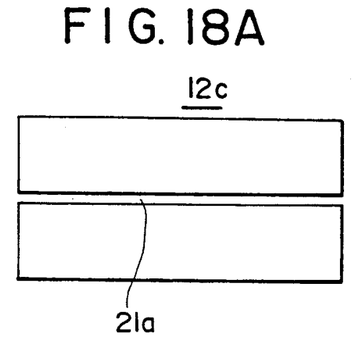
FIGS. 18(A)–18(F) are diagrams showing various examples of the stress relaxation structure used in the package of the present invention.

Referring to the drawings, the stage part 12c is provided with one or more apertures or openings such as an aperture 21a shown in FIG. 18(A) for absorbing a mechanical stress that occurs in the stage part 12c at the time when the reflowing of the solder alloy is achieved. It should be noted that, without such apertures provided on the stage part 12c, there is a substantial risk that the semiconductor chip 15 will come off from the stage part 12c due to the mechanical deformation caused by the difference in the thermal expansion between the lead frame and the chip 15.

Figure 18B:
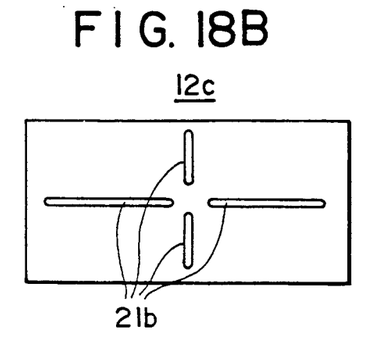
Figure 18C:
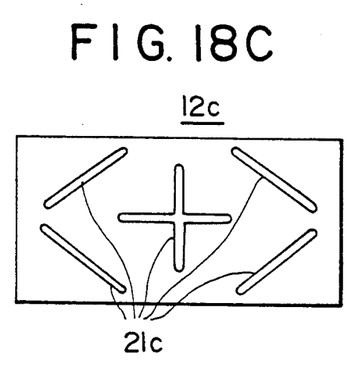
Figure 18D:
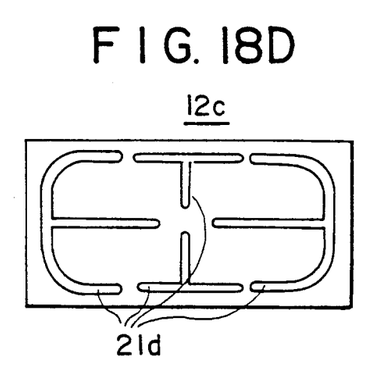
Figure 18E:
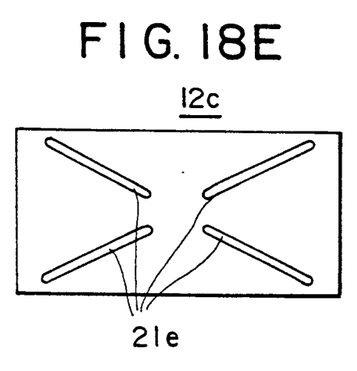
Figure 18F:
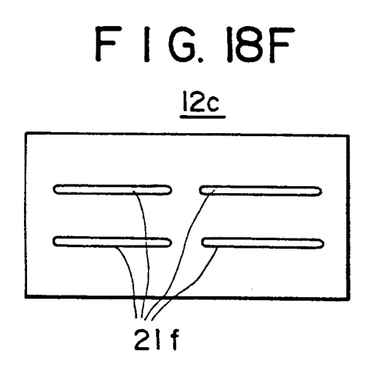

The aperture 21a of FIG. 18(A) extends laterally through the stage part 12c, while FIG. 18(B) shows four apertures 21b that are disposed laterally and vertically to form a cross-shaped pattern. FIG. 18(C), on the other hand, shows apertures 21c that include a cross-shaped opening at the center of the stage part 12c and four elongated openings that extend obliquely to surround the central cross-shaped pattern. FIG. 18(D) shows an aperture pattern 21d that includes a pair of T-shaped openings disposed oppositely of each other vertically and a pair of E-shaped openings that are disposed oppositely of each other laterally. FIG. 18(E) shows an aperture pattern 21e that includes four elongated openings disposed radially. Further, FIG. 18(F) shows four elongated apertures 21f that are disposed parallel with each other to extend laterally. Any of these apertures are effective in avoiding the concentration of the thermal stresses particularly at the time of the reflowing of the solder alloy.

Further, the present invention is not limited to the embodiments described heretofore, but also includes variations which and modifications may be made without departing from the scope of the invention.

What is claimed is:

1. A semiconductor device comprising:
   first and second semiconductor chips that are separate from each other;
   a first resin package body accommodating said first semiconductor chip, said first resin package body having a lower edge;
   a second resin package body accommodating said second semiconductor chip, said second resin package body having a lower edge;
   a first group of interconnection leads provided on said first package body and projecting outwardly from said first package body at said lower edge thereof, said first group of interconnection leads including a plurality of leads each having an inner lead part held inside the first package body and connected electrically to said first semiconductor chip, and an outer lead part located outside and said first resin package body for engagement with a substrate;
   a second group of interconnection leads provided on said second package body and projecting outwardly from said second package body at said lower edge thereof, said second group of interconnection leads including a plurality of leads each having an inner lead part held inside the second resin package body and connected electrically to said second semiconductor chip, and an outer lead part located outside the package body for engagement with said substrate; and
   a heat dissipation lead connecting said first resin package body and said second resin package body with each other, said heat dissipation lead comprising a first stage part embedded within said first resin package body and holding said first semiconductor chip thereon, a second stage part embedded within said second resin package body and holding said second semiconductor chip thereon, and a heat sink part located outside said first and second resin package bodies bridging said first stage part and said second stage part;
   each lead forming said first group of interconnection leads having said outer lead part at a level substantially flush with each said outer lead part of said second group of interconnection leads such that said semiconductor device is held upright on the substrate by said outer lead parts of said first and second group interconnection leads.

2. A semiconductor device comprising:

a semiconductor chip;

a resin package body accommodating therein said semiconductor chip, said package body having a lower edge and an upper edge;

a plurality of interconnection leads provided on said resin package body along said lower edge of the package body such that the interconnection leads project outwardly from said lower edge, each interconnection lead having an inner lead part held inside the package body and connected electrically to said semiconductor chip, and an outer lead part located outside said resin package body for contacting a surface of a substrate that supports the semiconductor device thereon; and a heat dissipation lead connected to said resin package body for dissipating heat generated by said semiconductor chip, said heat dissipation lead comprising a plate of a heat conducting material having a stage part and a heat sink part, said stage part being mounted inside said resin package body and supporting said semiconductor chip thereon, said heat sink part initially extending outwardly from said resin package body in an upward direction from said upper edge and subsequently is bent to include a part that extends in a downward direction, said heat sink part having a lower edge that is formed at a level substantially flush with said outer lead parts of said interconnection leads such that the semiconductor device is held upright, when placed on the substrate, by said outer lead parts of said interconnection leads and by said lower edge of said heat sink part of said heat dissipation lead.

3. A semiconductor device as claimed in claim 2 in which said outer lead part of said interconnection leads is bent laterally for engagement with said substrate.

4. A semiconductor device as claimed in claim 2 in which each said outer lead part of said interconnection leads is bent laterally in one of two opposite directions.

5. A semiconductor device as claimed in claim 4 in which said outer lead parts are bent alternately in said two opposite directions.

6. A semiconductor device as claimed in claim 2 in which said package body has a substantially flat side wall, and said heat sink part of said heat dissipation lead extends in the downward direction along said flat side wall.

7. A semiconductor device as claimed in claim 6 in which said heat sink part is connected with said side wall of said package body by a heat conducting material.

8. A semiconductor device as claimed in claim 7 in which said heat conducting materials is an adhesive.

9. A semiconductor device as claimed in claim 6 in which said lower edge of said heat sink part is bent laterally for engagement with said substrate.

10. A semiconductor device as claimed in claim 6 in which said lower edge of said heat sink part includes a plurality of teeth spaced from each other and projecting laterally for engagement with said substrate.

11. A semiconductor device as claimed in claim 10 in which each tooth of said teeth projects laterally in one of two opposing directions.

12. A semiconductor device as claimed in claim 10 in which each tooth of said teeth is formed in correspondence to a space formed between adjacent interconnection leads.

13. A semiconductor device as claimed in claim 1 in which each outer lead part is bent laterally at a part where the interconnection lead emerges from the lower edge of the package body.

14. A semiconductor device as claimed in claim 1 in which said stage part includes an aperture for relieving a concentration of thermal stress in an area where said stage part contacts said semiconductor chip.

15. A semiconductor device as claimed in claim 1 in which said heat dissipation lead comprises a composite plate comprising one or more of first alloy layers containing iron and one or more of second alloy layers containing copper, said first alloy layers having a total thickness t and said second alloy layers having a total thickness T that satisfy a relationship $$0.3 \leq t/T \leq 2.$$

16. A semiconductor device as claimed in claim 1 in which said heat dissipation lead comprises a composite plate comprising one or more of first alloy layers containing iron and one or more of second alloy layers containing copper, said first alloy layers having a total thickness t and said composite plate having a thickness W that satisfy a relationship $$0.4 \leq t/W \leq 0.7.$$

* * * * *

UNITED STATES PATENT AND TRADEMARK OFFICE
CERTIFICATE OF CORRECTION

PATENT NO.     : 5,305,179
DATED          : April 19, 1994
INVENTOR(S)    : Sono et al.

Page 1 of 1

It is certified that error appears in the above-identified patent and that said Letters Patent is hereby corrected as shown below:

Column 1,
Line 44, after "4" insert -- each --.

Column 3,
Line 43, after "Thus," insert -- the --.

Column 5,
Line 37, after "for" insert -- improved mechanical stability of the device. By --.

Column 8,
Line 24, change "variations which and modifications" to -- variations and modifications which --.

Column 10,
Line 23, change "1" to -- 2 --;
Line 27, change "1" to -- 2 --;
Line 31, change "1" to -- 2 --;
Line 41, change "1" to -- 2 --.

Signed and Sealed this

Seventeenth Day of December, 2002

JAMES E. ROGAN
*Director of the United States Patent and Trademark Office*